United States Patent [19]

Oakley et al.

[11] Patent Number: 4,587,395
[45] Date of Patent: May 6, 1986

[54] BONDING LEADS TO SEMICONDUCTOR DEVICES

[75] Inventors: Peter J. Oakley; Norman R. Stockham, both of Cambridge; Heidi M. Miller, Essex, all of England

[73] Assignee: The Welding Institute, Cambridge, England

[21] Appl. No.: 558,625

[22] Filed: Dec. 6, 1983

[30] Foreign Application Priority Data

Dec. 6, 1982 [GB] United Kingdom ................. 8234733

[51] Int. Cl.[4] ............................................. B23K 26/00
[52] U.S. Cl. ........................ 219/121 LD; 219/121 LF
[58] Field of Search ................. 219/121 LC, 121 LD, 219/121 LE, 121 LF, 121 EC, 121 ED; 29/846

[56] References Cited

U.S. PATENT DOCUMENTS

| | | | |
|---|---|---|---|
| 3,614,832 | 10/1971 | Chance et al. ........................ | 29/846 |
| 3,718,968 | 3/1973 | Sims et al. ................. | 219/121 LF X |
| 4,256,948 | 3/1981 | Wolf et al. ..................... | 219/121 LE |

Primary Examiner—C. L. Albritton
Attorney, Agent, or Firm—Martin Novack

[57] ABSTRACT

In the bumped-tape automated bonding process for connecting leads to a semi-conductor circuit device, it is known to form the bumps on the free ends of the conductive leads of the tape by plating or etching. In the present invention, the free ends of the leads on the tape are heated by means of a laser beam to melt the ends of the leads so that surface tension forces form the liquid-phase end of each lead into a ball, constituting the bonding bump. The bumped ends of the leads of the tape are then bonded to terminals of the semiconductor device by conventional means.

12 Claims, 11 Drawing Figures

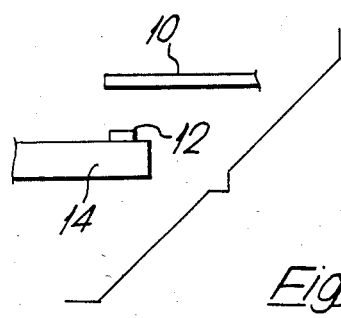
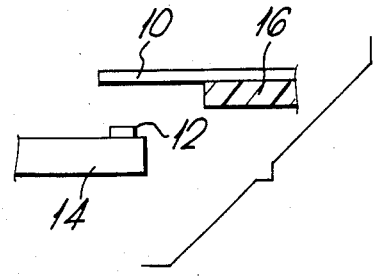
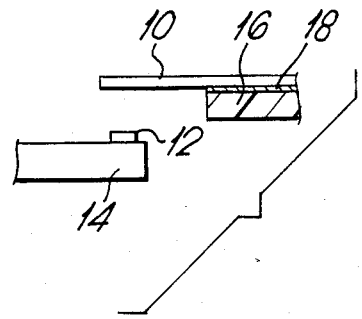
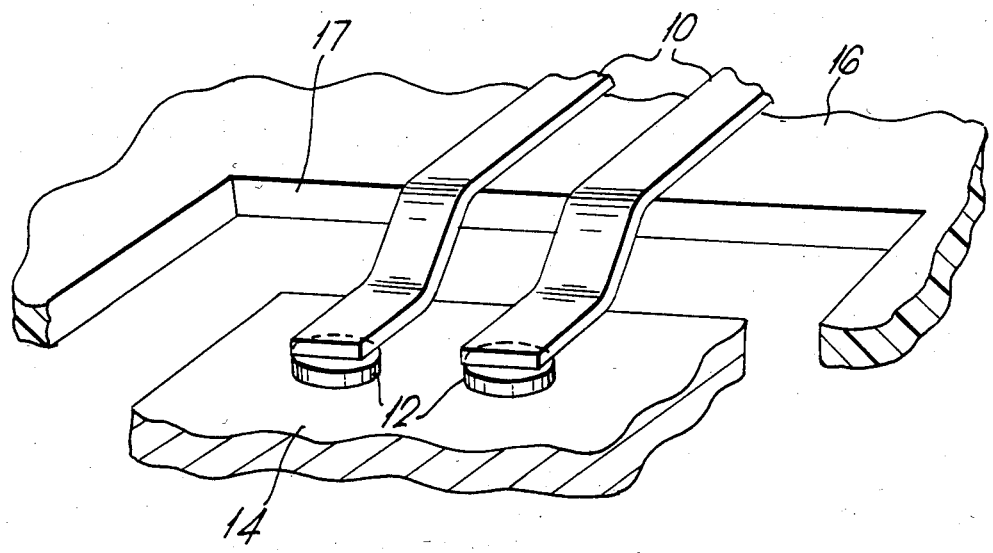

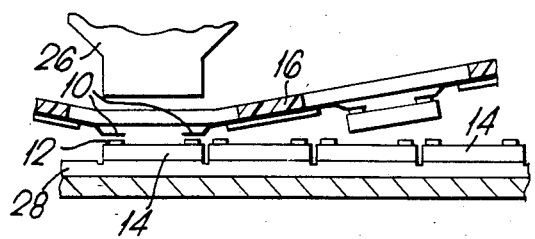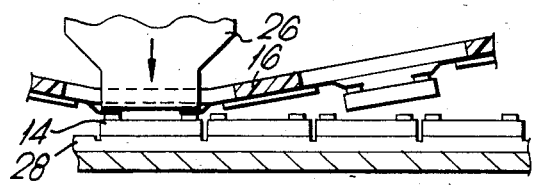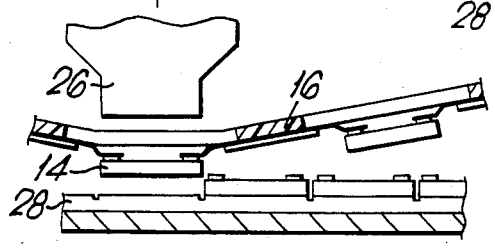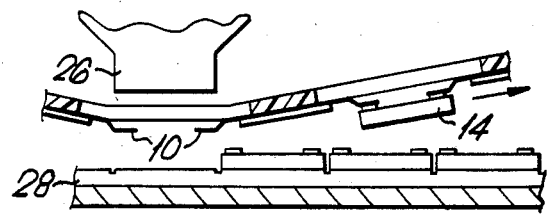

BONDING LEADS TO SEMICONDUCTOR DEVICES

The interconnection of integrated circuit devices is necessary during the manufacture of hybrid and discrete devices. Such interconnection is generally accomplished by wire bonding, a process which is inherently slow because each wire has to be welded individually. Automatic wire bonding machines are capable of forming connections to devices at up to 10 loops per second when using 25 μm diameter wire. Various techniques have been devised to increase the speed of the operation by making several joints at the same time and to improve the reliability of the micro-circuit interconnections. The most successful of these has been a process which has become known as tape automated bonding (TAB). In this technique, the leads are fabricated in a continuous film and in each operation the free ends of leads are connected to metallic bonding projections ("bumps") on the semiconductor chip. The tapes are available in three forms, as shown in FIGS. 1a, 1b and 1c. In the first of these forms, illustrated in FIG. 1a, a single layer of metal foil, for example, copper or aluminum foil, exists in the form of a tape, the metal foil being etched to form the required pattern of separate leads, which are of course interconnected to form the tape. As these interconnections short-circuit the leads, this single-layer tape does not allow pre-testing of the device. When the ends of the single tape layer 10 have been bonded to the bumps 12 on the chip 14, the interconnecting portions of the tape are cut away to separate the leads.

A two-layer form of tape is illustrated in FIG. 1b. This comprises a laminate of copper and an insulator of plastics material. The insulator may for example be a film of polyimide bonded directly to the metal foil leads. This is available in both testable and untestable formats.

In the three-layer form illustrated in FIG. 1c, the dielectric film 16 is usually thicker and is joined to the metal foil by means of a layer 18 of an adhesive.

Each frame of the film has sprocket holes for indexing and registration. As shown in FIG. 1d, the plastics film is formed with windows 17 and the ends of the leads 10 which are to be connected to the bumps 12 on the chip 14 overhang the edge of a window. The bumps provide both the necessary bonding metallurgy and compliance for inner lead bonding and the physical spacing to prevent short-circuiting of the lead to the chip.

FIG. 2 shows the manner in which the bump is typically applied to the silicon chip. A three-level metallisation consisting of an aluminum pad 20, a layer 22 of adhesion metal and a layer 24 of diffusion barrier metal is first applied to the chip 14, after which the bump 12 of copper, gold or tin/lead is electro-plated over the barrier metallisation to form a contact pad for the tape of copper or tin- or gold-plated copper. A number of leads are simultaneously bonded to their respective bumps, usually by thermocompression, eutectic or solder-reflow bonding, depending on the tape and bump metallurgies.

FIG. 3 illustrates a typical bonding sequence. A heated tool or electrode 26 descends through a window in the film 16, pressing the inner leads against the bumps to form a bond. The chip is released from the underlying wax layer 28 by the heat of the operation [FIG. 3c] and a new set of inner leads are brought into position for bonding to the bumps on a new chip [FIG. 3d]. The heated tool then again descends through a window in the film 16 to make a fresh set of bonds.

Although this approach has been commercially successful, it has the disadvantage of requiring a relatively expensive additional operation to put the bumps on the silicon chip. This may not be economic in applications requiring small numbers of a variety of devices.

To remove the need for extra processing of the silicon wafers, it is possible to form the projection on the tape instead of the chip. This process is known as bumped tape automated bonding [BTAB]. It provides the same benefits as the conventional bumped-chip process, i.e. speed and bond strength, without the need for specialized chips. The bumped tape is illustrated in FIG. 4; the bump 12a was formed by selectively etching the metal tape. Typically, a single layer copper tape of 70 μm thickness is etched to a thickness of 35 μm for the leads, with an extra 35 μm of thickness for the bumps. A plating process can be used in place of the etching process; the plating process is more likely to be used when gold bumps are to be added to the metal tape than when copper bumps are required. However, the bumped tape process has encountered problems in that it is difficult to produce bumps of consistent size, surface topography and hardness, and as a consequence inconsistent bonding occurs.

According to the present invention, a method of forming connecting bumps on the free ends of the conductive leads of a tape for use in the bumped-tape automated bonding process of connecting leads to a semiconductor circuit device, includes heating the free ends of the leads on the tape by means of a laser beam to melt the ends of the leads so that surface-tension forces form the liquid-phase end of each lead into a ball, constituting the bonding bump. Thereafter bonding the bumped ends of the leads of the tape to terminals of the device may be accomplished by conventional techniques.

Reference has already been made to FIGS. 1 to 4 of the accompanying drawings and a method embodying the invention will now be described with reference to FIG. 5. In the drawings:

FIGS. 1a, 1b and 1c illustrate different forms of tape available for bonding two chips and FIG. 1d illustrates a tape in position for bonding to a chip;

FIG. 2 illustrates the manner in which a bump is applied to a chip in a known process;

Figure 4:
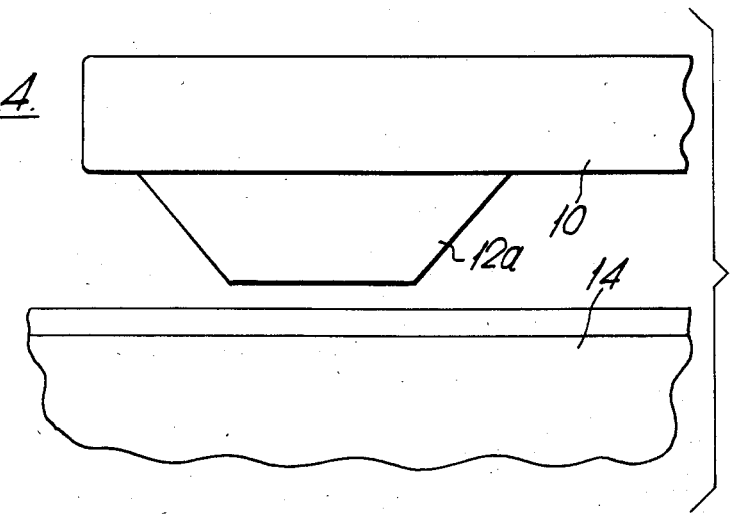

FIGS. 3a, 3b, 3c and 3d illustate a known process for bonding tape to bumped chips;

FIG. 4 illustrates a bumped tape for bonding to a chip in a known process; and

Figure 5:
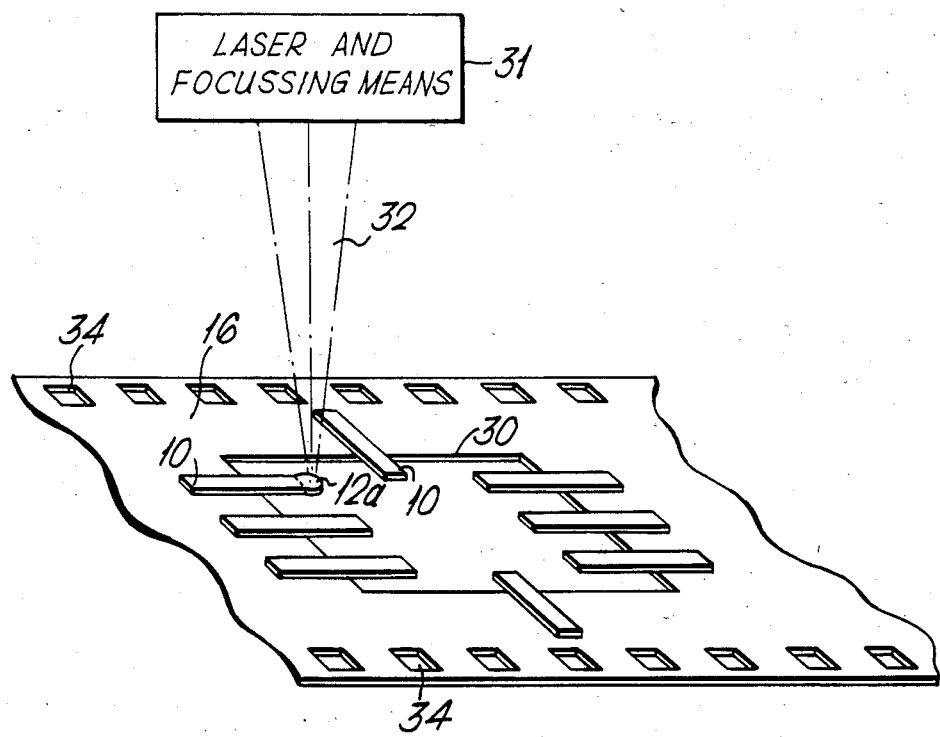

FIG. 5 illustrates the method according to the present invention for forming bumps on tape connectors.

FIG. 5 shows a polyimide tape 16, containing sprocket holes 34, which supports leads 10 to be bonded to a semiconductor device. The ends of the leads overhang the edge of a window 30 in the tape. A beam 32 from a laser 31 is focussed on the end of each lead in turn to form the bump 12a.

The bumps may be applied to the leads by the tape manufacturer.

When the bumps have been formed on the leads, the connections to the chip may be formed by a method similar to that illustrated in FIG. 3.

When the inner connection to the chips have been formed in this way, the chips are carried, on the tape, to a station at which the outer lead bonds are made to a printed circuit board or other carrier. The insulating film is then removed to enable the outer bonds to be made.

The laser used in the method illustrated in FIG. 5 is preferably a pulsed Nd/YAG laser, but other lasers (for example $CO_2$), with a pulsed or continuous-wave output may be used. A single pulse of the laser beam may be directed at each lead or finger with the tape stationary, the beam then moving on to the next lead or finger; alternatively, the tape may be moved at a uniform speed under a rapidly pulsed beam. A tape moved at uniform speed may also be used in conjunction with a continuous wave beam. As an alternative to moving the tape between the formation of successive bumps, the laser beam itself may be moved by means of mirrors. Because the metal foils used for the tape (such as copper and aluminum foils) are highly reflective, the focus for the laser beam should be at or close to the surface of the leads or fingers. For some materials, an inert gas shield may be required.

We have used a pulse energy of 2J when forming bumps on copper tape with a single pulse per finger, and a pulse energy of 2J, with a repetition rate of 50 Hz and traverse speed of 1.5 m/min (25 mm/sec) when using the alternative method of scanning the beam across a row of fingers. The pulse energy required will of course depend on tape material and dimensions, and, in the case of the scanner beam, finger spacing.

We are aware that it has been proposed, for wire bonding to semiconductor devices, to form a ball on the end of a suspended wire by the use of a flame or by forming an arc discharge between the wire and an electrode, the ball being then bonded to a semiconductor device by a thermo-compression technique. However, in this earlier method of connection, the wire was of circular cross-section and hung from a wire feed device, the lower end of the hanging wire being heated to form the suspended ball. Although the automated bonding process involving forming bumps on tape leads by etching or plating has been known since 1978, we are not aware of any previous proposal to form bumps on the ends of the flat lead portions of the tape used in this process by means of a laser, or by any other form of heat source.

The present invention may be used with any of the forms of tape illustrated in FIGS. 1a to 1c.

We claim:

1. A method of forming bumps on the free ends of the conductive flat leads of a tape for use in the bumped-tape automated bonding process of connecting leads to a semi-conductor circuit device, the method including:
   locating a focusing lens in the path of a beam from a laser;
   relatively positioning the focused laser beam and each lead in succession so that the surface of the lead is substantially at the focus of the laser beam; and subjecting each lead in turn to a single pulse of energy from the laser beam to melt the end of the lead so that surface tension forces form at the end of the lead a bump the width of which is not significantly larger than the width of the tape.

2. A method in accordance with claim 1, in which the laser used to provide the beam is a Nd/YAG laser.

3. A method in accordance with claim 1, in which, with the beam and tape stationary relative to one another, a single pulse of the laser beam is directed at each lead, the beam and tape undergoing relative movement between pulses to cause the next pulse to be aimed at the next lead.

4. A method in accordance with claim 1, in which the tape is moved continuously to bring the laser beam into alignment with each lead end in turn.

5. A method according to claim 4, in which the laser is pulsed for each such alignment.

6. A method in accordance with claim 1, in which the tape is stationary during the formation of a number of successive bumps, the laser beam being moved from lead end to lead end using reflective means.

7. A method of connecting flat leads to a semiconductor circuit device by the bumped-tape automated bonding process, the method including:
   locating a focusing lens in the path of a beam from a laser;
   relatively positioning the focused laser beam and each lead in succession so that the surface of the leads are successively placed substantially at the focus of the laser beam;
   subjecting each lead in turn to a single pulse of energy from the laser beam to melt the end of the lead so that surface tension forces form, at the end of the lead, a bump the width of which is not significantly larger than the width of the tape;
   and thereafter bonding the said bumps on the tape to terminals of the semiconductor circuit device.

8. A method in accordance with claim 7, in which the laser used to provide the beam is a Nd/YAG laser.

9. A method in accordance with claim 7, in which, with the beam and tape stationary relative to one another, a single pulse of the laser beam is directed at each lead, the beam and tape undergoing relative movement between pulses to cause the next pulse to be aimed at the next lead.

10. A method in accordance with claim 7, in which the tape is moved continuously to bring the laser beam into alignment with each lead end in turn.

11. A method according to claim 10, in which the laser is pulsed for each such alignment.

12. A method in accordance with claim 7, in which the tape is stationary during the formation of a number of successive bumps, the laser beam being moved from lead end to lead end using reflective means.

* * * * *